(12) United States Patent
Jeong

(10) Patent No.: US 7,339,849 B2
(45) Date of Patent: Mar. 4, 2008

(54) INTERNAL VOLTAGE SUPPLY CIRCUIT OF A SEMICONDUCTOR MEMORY DEVICE WITH A REFRESH MODE

(75) Inventor: Bong-Hwa Jeong, Icheon-shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 131 days.

(21) Appl. No.: 11/275,163

(22) Filed: Dec. 16, 2005

(65) Prior Publication Data

US 2006/0221743 A1 Oct. 5, 2006

(30) Foreign Application Priority Data

Apr. 1, 2005 (KR) ............... 10-2005-0027751

(51) Int. Cl.
G11C 11/4074 (2006.01)
G11C 5/14 (2006.01)
G11C 11/406 (2006.01)

(52) U.S. Cl. ............ 365/227; 365/226; 365/222; 365/149

(58) Field of Classification Search ........ 365/149, 365/222, 226, 227, 228, 229, 189.09, 189.11
See application file for complete search history.

(56) References Cited

U.S. PATENT DOCUMENTS

| 4,943,960 | A | 7/1990 | Komatsu et al. |
|---|---|---|---|
| 5,532,968 | A | 7/1996 | Lee |
| 5,563,837 | A * | 10/1996 | Noguchi .............. 365/222 |
| 5,594,699 | A * | 1/1997 | Nomura et al. ......... 365/226 |
| 5,668,497 | A * | 9/1997 | Kang et al. ............ 327/544 |
| 5,886,932 | A | 3/1999 | Choi |
| 5,995,434 | A | 11/1999 | Ryu |
| 6,333,873 | B1 | 12/2001 | Kumanoya et al. |
| 6,411,157 | B1 | 6/2002 | Hsu et al. |
| 6,426,908 | B1 * | 7/2002 | Hidaka ................. 365/222 |
| 2001/0010459 | A1 * | 8/2001 | Kobayashi et al. ...... 323/314 |
| 2005/0237848 | A1 * | 10/2005 | Takahashi et al. ....... 365/232 |

FOREIGN PATENT DOCUMENTS

| JP | 10199244 | 7/1998 |
|---|---|---|
| JP | 11-203861 | 7/1999 |
| KP | 10-2000-0065737 | 11/2000 |

OTHER PUBLICATIONS

A JPO computer translation of JP 11-203861 (Tsukamoto).*

* cited by examiner

Primary Examiner—J. H. Hur
(74) Attorney, Agent, or Firm—Marshall, Gerstein & Borun LLP

(57) ABSTRACT

An internal voltage supply circuit may Include a first internal voltage generator for receiving an external voltage and generating a first internal voltage, a second internal voltage generator for generating a second internal voltage lower than the first internal voltage, and a switching circuit responsive to a control signal, for supplying the second internal voltage to a refresh-associated circuit in a refresh mode and the first internal voltage to the refresh-associated circuit in normal mode. The control signal is enabled in the refresh mode.

16 Claims, 5 Drawing Sheets

INTERNAL VOLTAGE SUPPLY CIRCUIT OF A SEMICONDUCTOR MEMORY DEVICE WITH A REFRESH MODE

FIELD OF THE INVENTION

The present invention relates to an internal voltage supply circuit, and more particularly to an internal voltage supply circuit for supplying an internal voltage lower than the voltage in normal mode to circuits of a semiconductor device, particularly circuits associated with a refresh operation, when the semiconductor device is in refresh mode, thus making it possible to reduce current consumption of the semiconductor device.

DESCRIPTION OF THE RELATED ART

Generally, in a semiconductor device, particularly a dynamic random access memory (DRAM), one memory cell is composed of one selection transistor and one data storage capacitor. In this regard, the DRAM is widely used as a semiconductor memory device suitable for increasing the integration density of a semiconductor substrate. However, because the DRAM suffers charge leakage through the storage capacitor and selection capacitor, it has to periodically perform a refresh operation of recharging DRAM cells with charges.

Recently, as semiconductor memory devices have been developed to operate at higher speeds and lower power, a lower external voltage is applied to the memory device, resulting in a reduction in the level of an internal voltage for an internal operation of the memory device. Particularly, current consumption in the refresh operation has become a very important issue associated with the low-power operation and low current consumption of the semiconductor device. However, a conventional internal voltage supply circuit has the disadvantage of, in a refresh mode, supplying a voltage of the same level as that of a voltage in a normal mode, thereby increasing the current consumption in the refresh operation. This problem with the conventional internal voltage supply circuit will hereinafter be described with reference to the annexed drawings. Here, the normal mode refers to an operation mode in which active operations except the refresh operation, namely, actual operations including a data input operation, a data output operation, etc., are performed.

FIG. 1 shows the configuration of a conventional internal voltage supply circuit, and FIG. 2 shows the configuration of another conventional internal voltage supply circuit. As shown in these drawings, conventionally, an external voltage VDD or internal voltage VINT is applied simultaneously to a refresh-associated circuit 110 and a peripheral circuit 120 irrespective of the operation mode of a semiconductor device. Here, the external voltage VDD and the internal voltage VINT are voltages of relatively high levels that are applied for smooth operation executions of the refresh-associated circuit 110 and peripheral circuit 120 when the semiconductor device is in a normal mode, not a refresh mode. The refresh-associated circuit 110 signifies a circuitry including circuit elements that are actually operated to perform a refresh operation, and the peripheral circuit 120 signifies a circuitry including circuit elements that are operated to perform general logic operations except the refresh operation, such as a data input operation and a data output operation.

As shown in FIG. 1 or 2, conventionally, the external voltage VDD or internal voltage VINT of the high level is always applied simultaneously to the refresh-associated circuit 110 and the peripheral circuit 120. For this reason, the external voltage VDD or internal voltage VINT of the high level is applied to the refresh-associated circuit 110 in the refresh mode, as well as in the normal mode. In general terms, because the amount of charge to be driven in the refresh mode is determined depending on the capacitance and voltage level, the amount of current to be consumed in the refresh mode is greatly influenced by the voltage to be supplied. In conclusion, a conventional internal voltage supply circuit designed to supply the high voltage as stated above in the refresh mode, and a semiconductor device using the same are disadvantageous in that current consumption of the semiconductor device is increased, causing a reduction in power efficiency thereof.

SUMMARY OF THE INVENTION

An internal voltage supply circuit supplies an internal voltage lower than a voltage in a normal mode to circuits of a semiconductor device, particularly circuits associated with a refresh operation, when the semiconductor device is in a refresh mode, thus making it possible to reduce current consumption of the semiconductor device.

The internal voltage supply circuit may include a first internal voltage generator for generating an internal voltage lower than an external voltage. A switching circuit responsive to a control signal supplies the internal voltage to a refresh-associated circuit in a refresh mode and the external voltage to the refresh-associated circuit in a normal mode. The control signal may be enabled in the refresh mode.

The switching circuit may include a first switch for supplying the external voltage to the refresh-associated circuit in the normal mode in response to the control signal, and a second switch for supplying the internal voltage to the refresh-associated circuit in the refresh mode in response to the control signal.

The first switch may include a first PMOS transistor. The second switch may include an inverter for inversion-buffering the control signal, and a second PMOS transistor operated in response to an output signal from the inverter.

Alternatively, the first switch may include a first NMOS transistor, and the second switch may include an inverter for inversion-buffering the control signal, and a second NMOS transistor operated in response to an output signal from the inverter.

Alternatively, the first switch may include a PMOS transistor, and the second switch may include an NMOS transistor.

Alternatively, the first switch may include an NMOS transistor, and the second switch may include a PMOS transistor.

The first internal voltage generator may generate the internal voltage for a cell operation of a semiconductor device, and the external voltage may be applied simultaneously to the refresh-associated circuit and a peripheral circuit in the normal mode.

The internal voltage supply circuit may further include a second internal voltage generator that supplies an internal voltage of the same level as that of the internal voltage from the first internal voltage generator to the refresh-associated circuit irrespective of an operation mode of a semiconductor device.

An internal voltage supply circuit may include a first internal voltage generator for receiving an external voltage and generating a first internal voltage. A second internal voltage generator may generate a second internal voltage lower than the first internal voltage. A switching circuit is responsive to a control signal to supply the second internal voltage to a refresh-associated circuit in a refresh mode and the first internal voltage to the refresh-associated circuit in a normal mode. The control signal may be enabled in refresh mode.

The switching circuit may include a first switch for supplying the first internal voltage to the refresh-associated circuit in the normal mode in response to the control signal, and a second switch for supplying the second internal voltage to the refresh-associated circuit in the refresh mode in response to the control signal.

The first switch may include a first PMOS transistor, and the second switch may include an inverter for inversion-buffering the control signal, and a second PMOS transistor operated in response to an output signal from the inverter.

Alternatively, the first switch may include a first NMOS transistor, and the second switch may include an inverter for inversion-buffering the control signal, and a second NMOS transistor operated in response to an output signal from the inverter.

Alternatively, the first switch may include a PMOS transistor, and the second switch may include an NMOS transistor.

Alternatively, the first switch may include an NMOS transistor, and the second switch may include a PMOS transistor.

The second internal voltage generator may generate the second internal voltage for a cell operation of a semiconductor device, and the first internal voltage may be applied simultaneously to the refresh-associated circuit and a peripheral circuit in the normal mode.

The internal voltage supply circuit may further include a third internal voltage generator for supplying a third internal voltage of the same level as that of the second internal voltage from the second internal voltage generator to the refresh-associated circuit irrespective of an operation mode of a semiconductor device.

BRIEF DESCRIPTION OF THE DRAWINGS

Features and advantages of the present invention will be more clearly understood from the following detailed description taken in conjunction with the accompanying drawings, in which.

DETAILED DESCRIPTION

Figure 1:
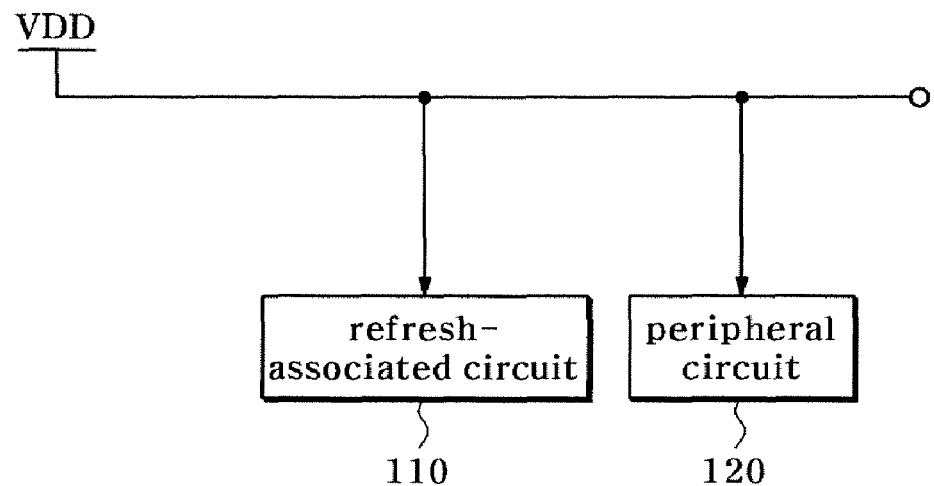
FIG. 1 is a block diagram showing the configuration of a conventional internal voltage supply circuit.
Figure 2:
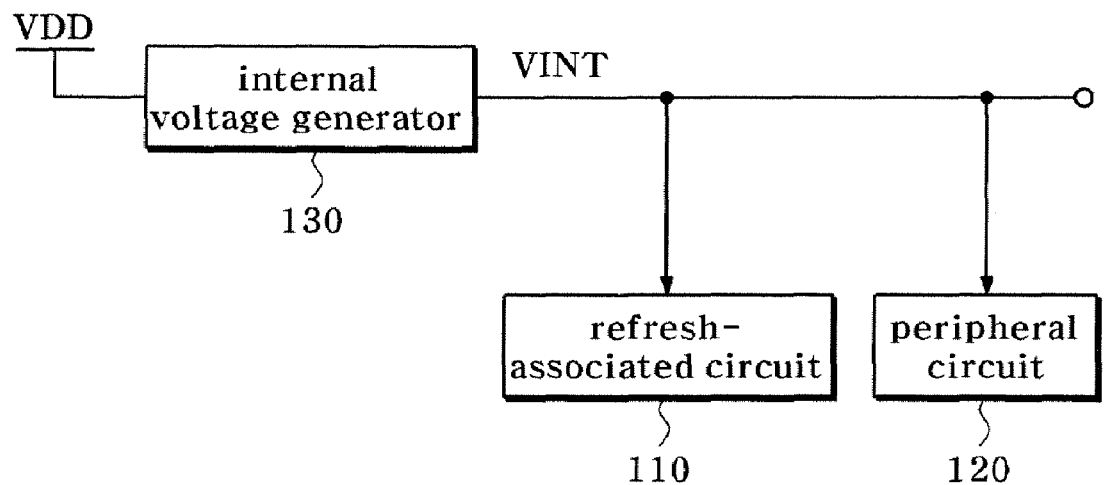
FIG. 2 is a block diagram showing the configuration of another conventional internal voltage supply circuit.

Reference will now be made in detail to the described embodiments of the present invention, examples of which are illustrated in the accompanying drawings, wherein like reference numerals refer to like elements throughout.

Figure 3:
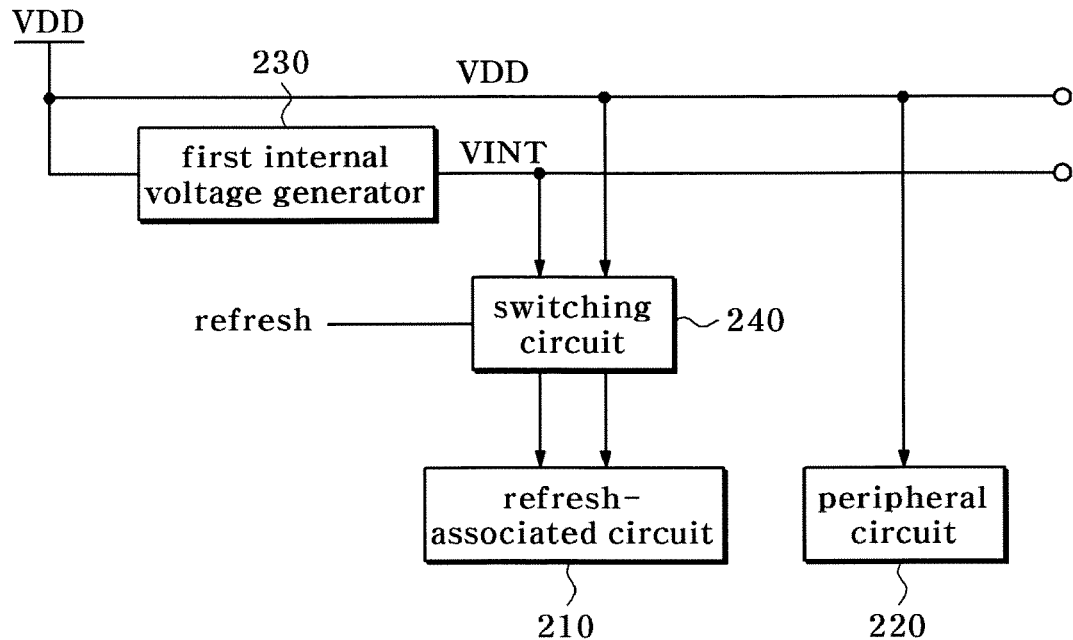
FIG. 3 is a block diagram showing the configuration of an internal voltage supply circuit according to a first described embodiment.
Figure 5:
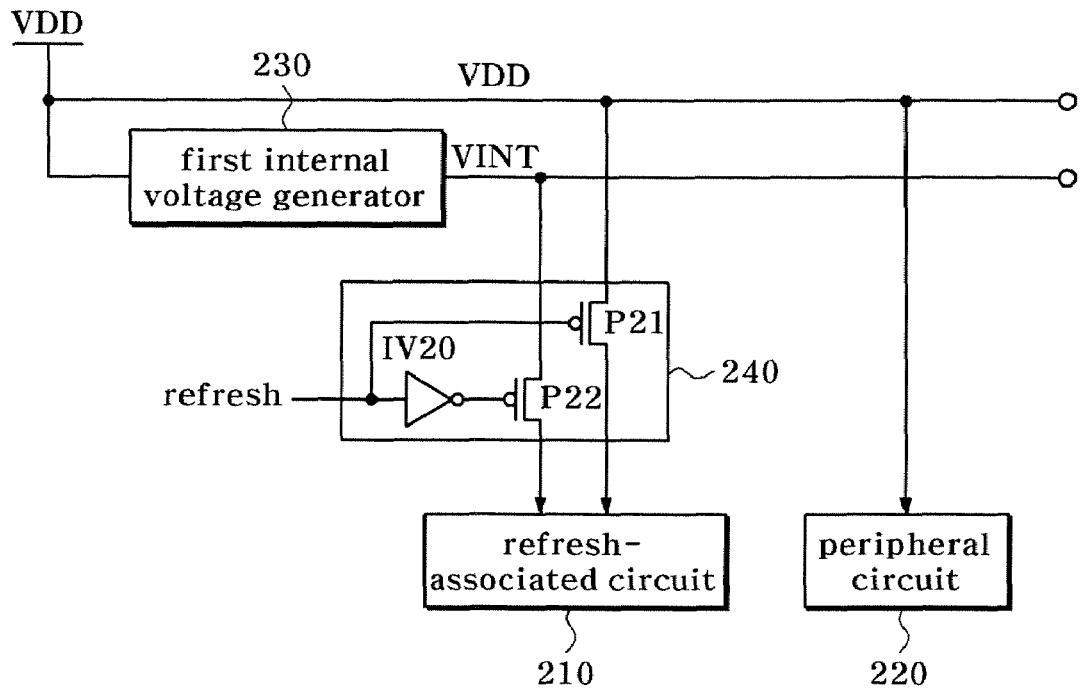
FIG. 5 is a circuit diagram of an embodiment of a switching circuit in FIG. 3.

FIGS. 3 and 5 show the configuration of an internal voltage supply circuit according to a first described embodiment. As shown in FIGS. 3 and 5, an internal voltage supply circuit may include an internal voltage generator 230 for generating an internal voltage VINT lower than an external voltage VDD, and a switching circuit 240 operated in response to a control signal refresh which is enabled in a refresh mode. The switching circuit 240 may act to supply the internal voltage VINT to a refresh-associated circuit 210 in the refresh mode and the external voltage VDD to the refresh-associated circuit 210 in a normal mode.

The switching circuit 240 may include, as shown in FIG. 5, a first switch for supplying the external voltage VDD to the refresh-associated circuit 210 in the normal mode in response to the control signal refresh, and a second switch for supplying the internal voltage VINT to the refresh-associated circuit 210 in the refresh mode in response to the control signal refresh. The first switch may include a PMOS transistor P21, and the second switch may include an inverter IV20 and a PMOS transistor P22.

The operation of the internal voltage supply circuit with the above-stated configuration according to the first embodiment will hereinafter be described with reference to FIGS. 3 and 5 in conjunction with respective operation modes of a semiconductor device.

A description will first be given of the operation of the internal voltage supply circuit in the case where the operation mode of the semiconductor device is the normal mode, namely, an operation mode in which active operations except a refresh operation (i.e., actual operations including a data input operation, a data output operation, etc.) are performed.

In the normal mode, the external voltage VDD is supplied simultaneously to the refresh-associated circuit 210 and a peripheral circuit 220, as shown in FIG. 3. At this time, the switching circuit 240 acts to switch the external voltage VDD to the refresh-associated circuit 210 in response to the control signal refresh such that the external voltage VDD is applied to the refresh-associated circuit 210 in the normal mode. That is, in the normal mode, the control signal refresh assumes a low level. As a result, in the switching circuit 240, as shown in FIG. 5, the PMOS transistor P21 is turned on in response to the control signal refresh and the PMOS transistor P22 is turned off in response to the control signal refresh, thereby causing the external voltage VDD to be applied to the refresh-associated circuit 210. Consequently, in the normal mode, the external voltage VDD is applied to the refresh-associated circuit 210 such that operations associated with the normal mode are performed.

Here, the control signal refresh indicates that the semiconductor device is in a refresh operation. Namely, the control signal refresh remains disabled to be low in level in normal mode, and is then enabled to be high in level when the semiconductor device enters the refresh mode. The refresh-associated circuit 210 signifies a circuitry including circuit elements that are actually operated to perform the refresh operation, and the peripheral circuit 220 signifies a circuitry including circuit elements that are operated to perform general logic operations except the refresh operation, such as a data input operation and a data output operation.

Next, at the time that the semiconductor device enters the refresh mode, the internal voltage VINT, not the external voltage VDD, is supplied to the refresh-associated circuit 210, as shown in FIGS. 3 and 5. That is, because the control signal refresh makes a low to high level transition in the refresh mode, the output of the inverter IV20 becomes low in level to turn on the PMOS transistor P22, whereas the PMOS transistor P21 is turned off, as shown in FIG. 5. As a result, the internal voltage VINT is applied to the refresh-associated circuit 210. Here, the internal voltage generator 230 is a circuitry for generating the internal voltage VINT for a cell operation such as reading or writing of data from or into a cell. The internal voltage VINT is lower than the external voltage VDD. In other words, in the refresh mode, the internal voltage VINT lower than the external voltage VDD is applied to the refresh-associated circuit 210 such that operations associated with the refresh mode are performed.

As described above, according to the first embodiment, in the case where the operation mode of the semiconductor device is the refresh mode, an internal voltage lower than a voltage in the normal mode is supplied, so that current consumption of the semiconductor device can be reduced. Moreover, the internal voltage supply circuit according to the first embodiment can realize such a current consumption reduction without employing supplementary circuits for control of the supply voltage and without increasing a layout area and standby current. Therefore, an internal voltage supply circuit as described in connection with the first embodiment may provide an economic advantage in terms of the layout and power efficiency of the semiconductor device.

Figure 10:
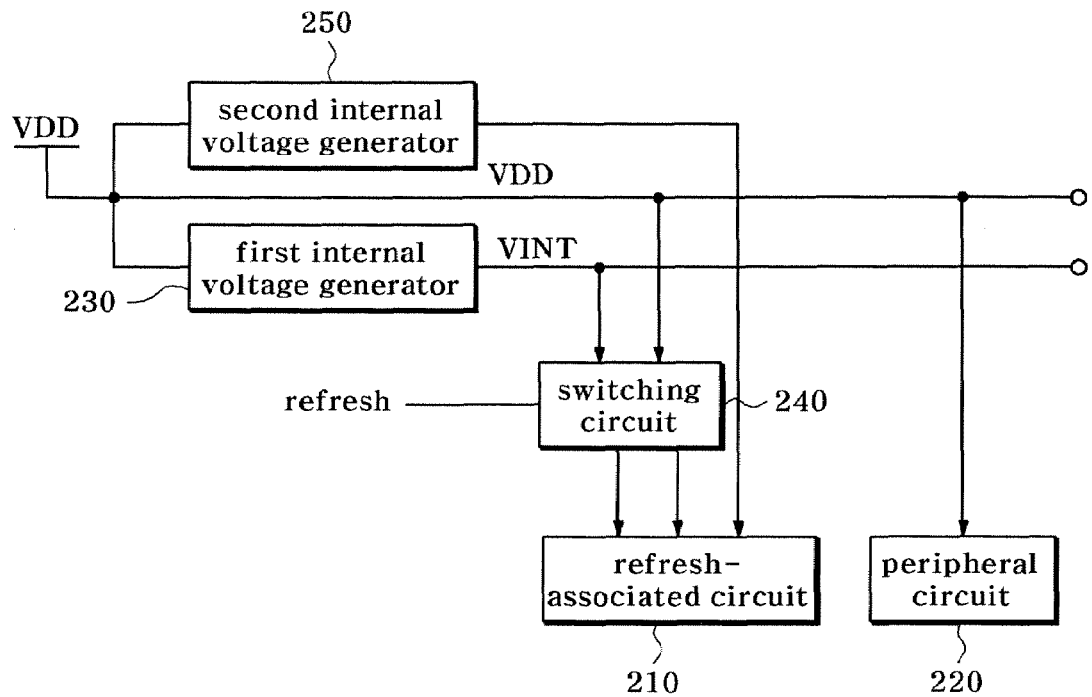
FIG. 10 is a block diagram of a modified embodiment of the first embodiment wherein a separate internal voltage generator is added to the first embodiment.

On the other hand, as shown in FIG. 10, the internal voltage supply circuit according to the first embodiment may further comprise a second internal voltage generator 250 for supplying an internal voltage of the same level as that of the internal voltage VINT from the first internal voltage generator 230 to the refresh-associated circuit 210. The second internal voltage generator 250 is a circuitry for generating and supplying the internal voltage of the same level as that of the internal voltage VINT to the refresh-associated circuit 210 irrespective of the operation mode of the semiconductor device. This second internal voltage generator 250 acts to prevent noise or bouncing which may occur when the operation mode of the semiconductor device is changed between the normal mode and the refresh mode, and to fill the current when it is insufficient.

Figure 7:
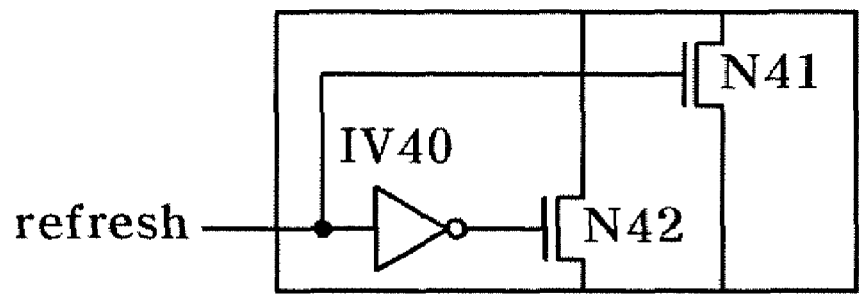
FIGS. 7 to 9 are circuit diagrams of different embodiments of each of the switching circuits in FIGS. 3 and 4.

As shown in FIG. 7, the first switch of the switching circuit 240 may include an NMOS transistor N41, and the second switch thereof may include an inverter IV40 and an NMOS transistor N42. In this case, the control signal refresh assumes a high level in the normal mode, and a low level in the refresh mode.

Figure 8:
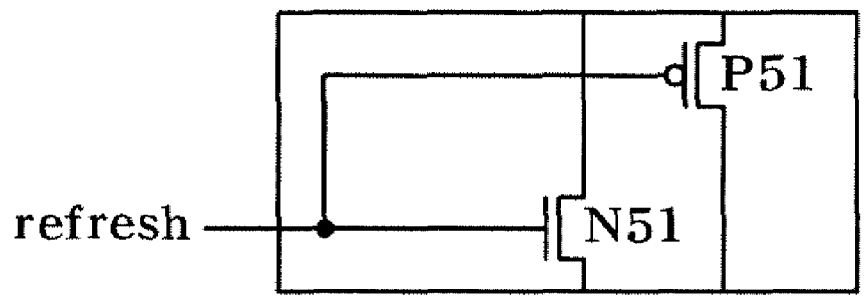

Alternatively, as shown in FIG. 8, the first switch of the switching circuit 240 may include a PMOS transistor P51, and the second switch thereof may include an NMOS transistor N51. In this case, the control signal refresh assumes a low level in the normal mode, and a high level in the refresh mode.

Figure 9:
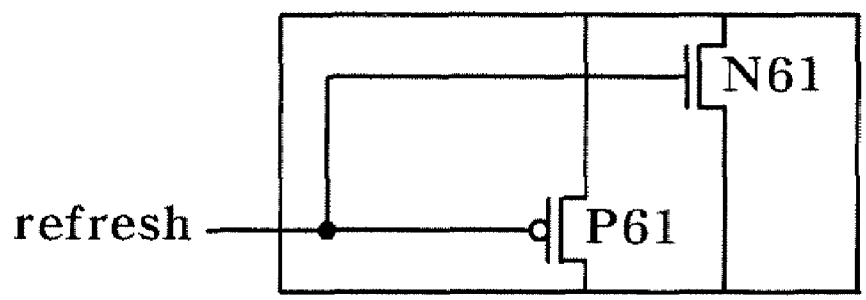

As another alternative, as shown in FIG. 9, the first switch of the switching circuit 240 may include an NMOS transistor N61, and the second switch thereof may include a PMOS transistor P61. In this case, the control signal refresh assumes a high level in the normal mode, and a low level in refresh mode.

Figure 4:
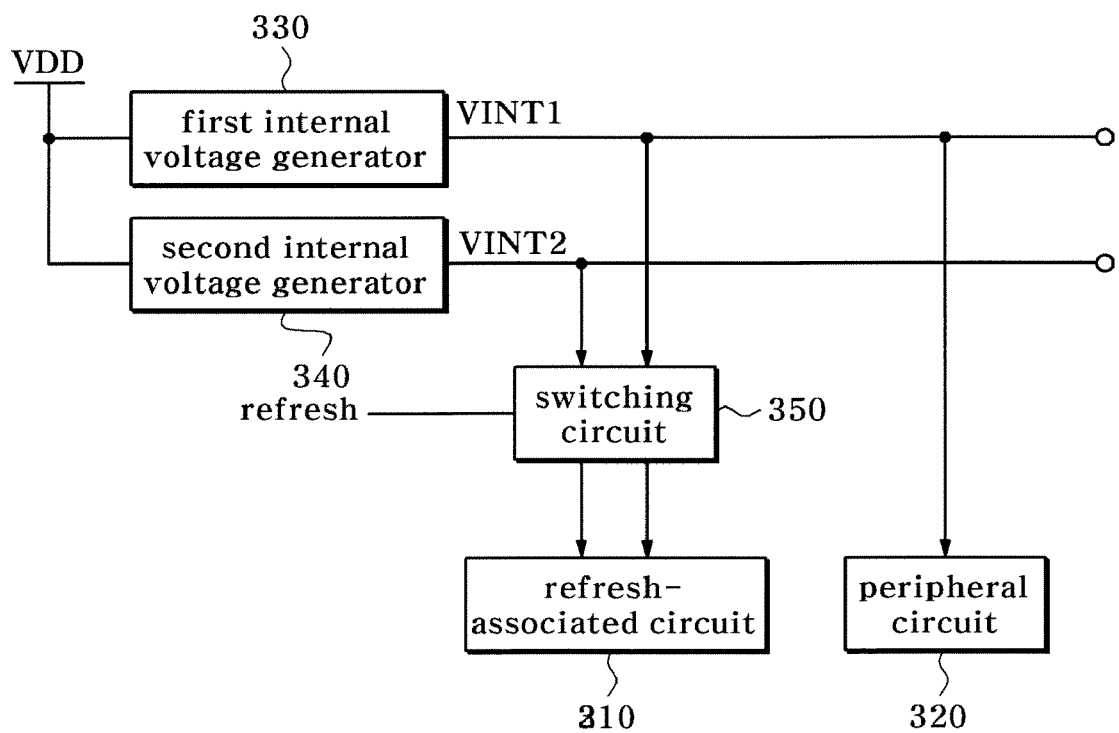
FIG. 4 is a block diagram showing the configuration of an internal voltage supply circuit according to a second described embodiment.
Figure 6:
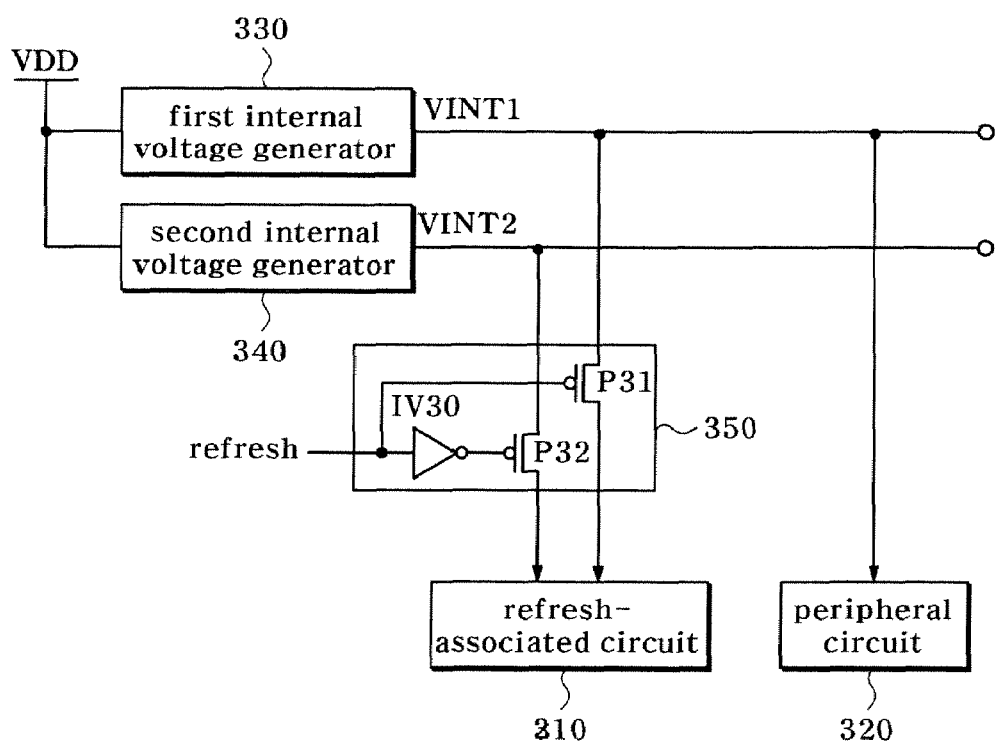
FIG. 6 is a circuit diagram of an embodiment of a switching circuit in FIG. 4.

Next, a description will be given of the internal voltage supply circuit according to a second described embodiment with reference to FIGS. 4 and 6. As shown in FIGS. 4 and 6, an internal voltage supply circuit may include a first internal voltage generator 330 for receiving an external voltage VDD and generating a first internal voltage VINT1, a second internal voltage generator 340 for generating a second internal voltage VINT2 lower than the first internal voltage VINT1, and a switching circuit 350 operated in response to a control signal refresh which is enabled in a refresh mode. The switching circuit 350 acts to supply the second internal voltage VINT2 to a refresh-associated circuit 310 in the refresh mode and the first internal voltage VINT1 to the refresh-associated circuit 310 in a normal mode.

The switching circuit 350 may include, as shown in FIG. 6, a first switch for supplying the first internal voltage VINT1 to the refresh-associated circuit 310 in the normal mode in response to the control signal refresh, and a second switch for supplying the second internal voltage VINT2 to the refresh-associated circuit 310 in the refresh mode in response to the control signal refresh. The first switch may include a PMOS transistor P31, and the second switch includes an inverter IV30 and a PMOS transistor P32.

The operation of the internal voltage supply circuit with the above-stated configuration according to the second embodiment will hereinafter be described with reference to FIGS. 4 and 6 in conjunction with respective operation modes of a semiconductor device.

A description will first be given of the operation of the internal voltage supply circuit in the case where the operation mode of the semiconductor device is the normal mode, namely, an operation mode in which active operations except a refresh operation (i.e., actual operations including a data input operation, a data output operation, etc.) are performed.

In the normal mode, the first internal voltage VINT1 is supplied simultaneously to the refresh-associated circuit 310 and a peripheral circuit 320, as shown in FIG. 4. At this time, the switching circuit 350 acts to switch the first internal voltage VINT1 to the refresh-associated circuit 310 in response to the control signal refresh such that the first internal voltage VINT1 is applied to the refresh-associated circuit 310 in the normal mode. That is, in normal mode, the control signal refresh assumes a low level. Thus, in the switching circuit 350, as shown in FIG. 6, the PMOS transistor P31 is turned on in response to the control signal refresh and the PMOS transistor P32 is turned off in response to the control signal refresh, thereby causing the first internal voltage VINT1 to be applied to the refresh-associated circuit 310. As a result, in the normal mode, the first internal voltage VINT1 is applied to the refresh-associated circuit 310 such that operations associated with the normal mode are performed.

Here, the control signal refresh indicates that the semiconductor device is in the refresh operation, similarly to that in the first embodiment. Namely, the control signal refresh remains disabled low in level in the normal mode, and is then enabled high in level when the semiconductor device enters the refresh mode. The refresh-associated circuit 310 and the peripheral circuit 320 are the same as those in the first embodiment. The first internal voltage generator 330 is a circuitry for generating the first internal voltage VINT1 to be used in the refresh-associated circuit 310 and the peripheral circuit 320 when the operation mode of the semiconductor device is the normal mode. The first internal voltage VINT1 is generated depending on the external voltage VDD and is higher than the second internal voltage VINT2 to be described later.

Next, when the semiconductor device enters refresh mode, the second internal voltage VINT2, not the first internal voltage VINT1, is supplied to the refresh-associated circuit 310, as shown in FIGS. 4 and 6. That is, because the control signal refresh makes a low to high level transition in the refresh mode, the output of the inverter IV30 becomes low in level to turn on the PMOS transistor P32, whereas the PMOS transistor P31 is turned off, as shown in FIG. 6. As a result, the second internal voltage VINT2 is applied to the refresh-associated circuit 310. Here, the second internal voltage generator 340 is a circuitry for generating the second internal voltage VINT2 for a cell operation such as reading or writing of data from or into a cell. The second internal voltage VINT2 is lower than the first internal voltage VINT1. In other words, in the refresh mode, the second internal voltage VINT2 lower than the first internal voltage VINT1 is applied to the refresh-associated circuit 310 such that operations associated with the refresh mode are performed.

As described above, according to the second embodiment, in the case where the operation mode of the semiconductor device is the refresh mode, an internal voltage lower than a voltage in the normal mode is supplied, so that current consumption of the semiconductor device can be reduced. In addition, the internal voltage supply circuit according to the second embodiment can realize such a current consumption reduction without employing supplementary circuits for control of the supply voltage and without increasing the layout area and standby current. Therefore, the internal voltage supply circuit according to this embodiment provides an economic advantage in terms of the layout and power efficiency of the semiconductor device.

Figure 11:
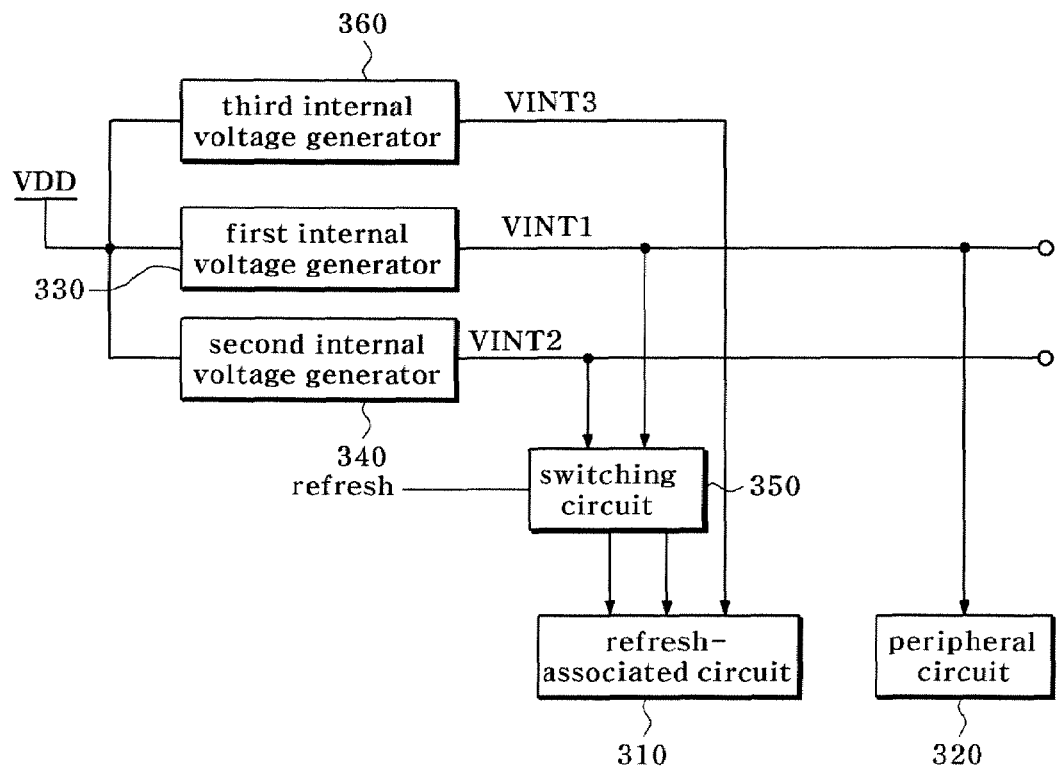
FIG. 11 is a block diagram of a modified embodiment of the second embodiment wherein a separate internal voltage generator is added to the second embodiment.

On the other hand, as shown in FIG. 11, the internal voltage supply circuit according to the second embodiment may further comprise a third internal voltage generator 360 for supplying a third internal voltage VINT3 of the same level as that of the second internal voltage VINT2 to the refresh-associated circuit 310. The third internal voltage generator 360 is a circuitry for generating and supplying the third internal voltage VINT3 of the same level as that of the second internal voltage VINT2 to the refresh-associated circuit 310 irrespective of the operation mode of the semiconductor device. This third internal voltage generator 360 acts to prevent noise or bouncing which may occur when the operation mode of the semiconductor device is changed between the normal mode and the refresh mode, and to fill up current when it is insufficient.

As shown in FIG. 7, the first switch of the switching circuit 350 may include the NMOS transistor N41, and the second switch thereof may include the inverter IV40 and NMOS transistor N42. In this case, the control signal refresh assumes a high level in the normal mode, and a low level in the refresh mode.

Alternatively, as shown in FIG. 8, the first switch of the switching circuit 350 may include the PMOS transistor P51, and the second switch thereof may include the NMOS transistor N51. In this case, the control signal refresh assumes a low level in the normal mode, and a high level in the refresh mode.

As another alternative, as shown in FIG. 9, the first switch of the switching circuit 350 may include the NMOS transistor N61, and the second switch thereof may include the PMOS transistor P61. In this case, the control signal refresh assumes a high level in the normal mode, and a low level in the refresh mode.

As apparent from the above description, provided is an internal voltage supply circuit for supplying an internal voltage lower than a voltage in a normal mode to circuits of a semiconductor device, particularly circuits associated with a refresh operation, when the semiconductor device is in a refresh mode, thereby reducing current consumption of the semiconductor device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An internal voltage supply circuit comprising:
   a first internal voltage generator for generating an internal voltage lower than an external voltage;
   a switching circuit responsive to a control signal, for supplying the internal voltage to a refresh-associated circuit in a refresh mode and the external voltage to the refresh-associated circuit in a normal mode; and
   a second internal voltage generator for supplying an internal voltage of the same level as that of the internal voltage from the first internal voltage generator to the refresh-associated circuit irrespective of the operation mode of a semiconductor.

2. The internal voltage supply circuit as set forth in claim 1, wherein the switching circuit includes:
   a first switch for supplying the external voltage to the refresh-associated circuit in the normal mode in response to the control signal; and
   a second switch for supplying the internal voltage to the refresh-associated circuit in the refresh mode in response to the control signal.

3. The internal voltage supply circuit as set forth in claim 2, wherein:
   the first switch includes a first PMOS transistor; and
   the second switch includes:
   an inverter for inversion-buffering the control signal; and
   a second PMOS transistor operated in response to an output signal from the inverter.

4. The internal voltage supply circuit as set forth in claim 2, wherein:
   the first switch includes a first NMOS transistor; and
   the second switch includes:
   an inverter for inversion-buffering the control signal; and
   a second NMOS transistor operated in response to an output signal from the inverter.

5. The internal voltage supply circuit as set forth in claim 2, wherein:
   the first switch includes a PMOS transistor; and
   the second switch includes an NMOS transistor.

6. The internal voltage supply circuit as set forth in claim 2, wherein:
   the first switch includes an NMOS transistor; and
   the second switch includes a PMOS transistor.

7. The internal voltage supply circuit as set forth in claim 1, wherein:
   the first internal voltage generator is adapted to generate the internal voltage for a cell operation of a semiconductor device; and
   the external voltage is applied simultaneously to the refresh-associated circuit and a peripheral circuit in the normal mode.

8. The internal voltage supply circuit as set forth in claim 1, the control signal being enabled in the refresh mode.

9. An internal voltage supply circuit comprising:
   a first internal voltage generator for receiving an external voltage and generating a first internal voltage;

a second internal voltage generator for generating a second internal voltage lower than the first internal voltage; and a switching circuit responsive to a control signal, for supplying the second internal voltage to a refresh-associated circuit in a refresh mode and the first internal voltage to the refresh-associated circuit in a normal mode; and a third internal voltage generator for supplying a third internal voltage of the same level as that of the second internal voltage from the second internal voltage generator to the refresh-associated circuit irrespective of the operation mode of a semiconductor device.

10. The internal voltage supply circuit as set forth in claim 9, wherein the switching circuit includes:

a first switch for supplying the first internal voltage to the refresh-associated circuit in the normal mode in response to the control signal; and a second switch for supplying the second internal voltage to the refresh-associated circuit in the refresh mode in response to the control signal.

11. The internal voltage supply circuit as set forth in claim 10, wherein:

the first switch includes a first PMOS transistor; and the second switch includes:

an inverter for inversion-buffering the control signal; and a second PMOS transistor operated in response to an output signal from the inverter.

12. The internal voltage supply circuit as set forth in claim 10, wherein:

the first switch includes a first NMOS transistor; and the second switch includes:

an inverter for inversion-buffering the control signal; and a second NMOS transistor operated in response to an output signal from the inverter.

13. The internal voltage supply circuit as set forth in claim 10, wherein:

the first switch includes a PMOS transistor; and the second switch includes an NMOS transistor.

14. The internal voltage supply circuit as set forth in claim 10, wherein:

the first switch includes an NMOS transistor; and the second switch includes a PMOS transistor.

15. The internal voltage supply circuit as set forth in claim 9, wherein:

the second internal voltage generator is adapted to generate the second internal voltage for a cell operation of a semiconductor device; and the first internal voltage is applied simultaneously to the refresh-associated circuit and a peripheral circuit in the normal mode.

16. The internal voltage supply circuit as set forth in claim 9, the control signal being enabled in the refresh mode.

* * * * *

UNITED STATES PATENT AND TRADEMARK OFFICE
CERTIFICATE OF CORRECTION

PATENT NO.         : 7,339,849 B2
APPLICATION NO. : 11/275163
DATED                : March 4, 2008
INVENTOR(S)       : Bong Hwa Jeong Page 1 of 1

It is certified that error appears in the above-identified patent and that said Letters Patent is hereby corrected as shown below:

On the Title Page:

At field (57), line 1, "Include" should be -- include --.

In the Claims:

At Column 9, line 3, "voltage; and" should be -- voltage --.

Signed and Sealed this

Fifth Day of August, 2008

JON W. DUDAS
*Director of the United States Patent and Trademark Office*